(12) United States Patent
Dhindsa et al.

(10) Patent No.: US 6,786,175 B2
(45) Date of Patent: Sep. 7, 2004

(54) SHOWERHEAD ELECTRODE DESIGN FOR SEMICONDUCTOR PROCESSING REACTOR

(75) Inventors: Rajinder Dhindsa, San Jose, CA (US); Eric Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 121 days.

(21) Appl. No.: 10/020,413

(22) Filed: Dec. 18, 2001

(65) Prior Publication Data

US 2003/0032301 A1 Feb. 13, 2003

Related U.S. Application Data

(60) Provisional application No. 60/311,048, filed on Aug. 8, 2001.

(51) Int. Cl.[7] ............................ C23C 16/00; H05H 1/00
(52) U.S. Cl. ............................ 118/723 E; 118/723 R; 156/345.34; 156/345.47; 156/345.43
(58) Field of Search ........................ 118/723 E, 723 R; 156/345.34, 345.47, 345.43

(56) References Cited

U.S. PATENT DOCUMENTS

| | | |
|---|---|---|
| 4,340,462 A | 7/1982 | Koch |
| 4,464,223 A | 8/1984 | Gorin |
| 4,579,618 A | 4/1986 | Celestino et al. |
| 4,948,458 A | 8/1990 | Ogle |
| 5,074,456 A * | 12/1991 | Degner et al. ............... 228/121 |
| 5,200,232 A | 4/1993 | Tappan et al. |
| 5,262,029 A | 11/1993 | Erskine et al. |
| 5,569,356 A | 10/1996 | Lenz et al. |
| 5,572,398 A | 11/1996 | Federlin et al. |
| 5,671,116 A | 9/1997 | Husain et al. |
| 5,740,016 A | 4/1998 | Dhindsa |
| 5,805,408 A | 9/1998 | Maraschin et al. |
| 5,880,922 A | 3/1999 | Husain |
| 6,033,478 A | 3/2000 | Kholodenko |
| 6,074,488 A * | 6/2000 | Roderick et al. ........... 118/728 |
| 6,123,775 A | 9/2000 | Hao et al. |
| 6,278,600 B1 | 8/2001 | Shamouilian et al. |
| 6,292,346 B1 | 9/2001 | Ohno et al. |

FOREIGN PATENT DOCUMENTS

| | | |
|---|---|---|
| JP | 2001085398 | 3/2001 |
| JP | 2001267295 | 9/2001 |

OTHER PUBLICATIONS

Notification of Transmittal of the International Search Report or the Declaration for PCT/US02/24057 dated Apr. 24, 2003.

\* cited by examiner

Primary Examiner—Parviz Hassanzadeh
(74) Attorney, Agent, or Firm—Burns, Doane, Swecker & Mathis, LLP

(57) ABSTRACT

An electrode assembly of a semiconductor processing chamber wherein heat transfer between a backing plate and a showerhead electrode is improved by an electrostatic clamping arrangement, which includes a compliant material in contact with a surface of the showerhead electrode. The showerhead electrode is removably attached to the backing plate by a mechanical clamping arrangement which engages an outer periphery of the showerhead electrode. The electrostatic clamping arrangement is coextensive with the showerhead electrode to improve thermal conduction between the backing plate and the showerhead electrode.

22 Claims, 2 Drawing Sheets

SHOWERHEAD ELECTRODE DESIGN FOR SEMICONDUCTOR PROCESSING REACTOR

This application claims priority under 35 U.S.C. §§119 and/or 365 to Provisional Application No. 60/311,048, filed in the United States on Aug. 8, 2001; the entire content of which is hereby incorporated by reference.

FIELD OF THE INVENTION

The present invention relates to a showerhead electrode assembly for improved thermal uniformity in a semiconductor processing reactor. Specifically, the invention relates to an electrode plate removably clamped to a backing plate or heat sink plate using a compliant, thermally conductive electrostatic clamp. The invention also relates to a method of processing a semiconductor substrate such as a wafer with the showerhead electrode assembly.

BACKGROUND OF THE INVENTION

Vacuum processing chambers are generally used for chemical vapor depositing (CVD) and etching of materials on substrates by supplying process gas to the vacuum chamber and application of an RF field to the gas. For example, parallel plate, transformer coupled plasma (TCP™, also called ICP), and electron-cyclotron resonance (ECR) reactors are disclosed in commonly-owned U.S. Pat. Nos. 4,340,462; 4,948,458; and 5,200,232. During processing, the substrates are held in place within the vacuum chamber by substrate holders. Conventional substrate holders include mechanical clamps and electrostatic clamps (ESC), which clamp a wafer to a pedestal during processing. The pedestal may form both an electrode and a heat sink. Examples of mechanical clamps and ESC substrate holders are provided in commonly-owned U.S. Pat. Nos. 5,262,029, 5,740,016, and 5,671,116 and in U.S. Pat. No. 6,292,346. Substrate holders in the form of an electrode can supply radiofrequency (RF) power into the chamber, as disclosed in U.S. Pat. No. 4,579,618.

Electrostatic clamps secure a substrate to a pedestal by creating an electrostatic attractive force between the substrate and the clamp. A voltage is applied to one or more electrodes in the ESC so as to induce opposite polarity charges in the substrate and electrode(s), respectively. The opposite charges pull the substrate against the pedestal, thereby retaining the substrate.

In a monopolar design, the ESC comprises an electrode, a workpiece and a dielectric between them. In the normal mode of operation for a monopolar ESC the electrode is connected to the negative pole of a DC power supply. The workpiece is connected through the plasma to ground. Under this arrangement the workpiece is not securely clamped prior to exposing the workpiece to the plasma or other return path.

In a bipolar configuration the ESC can clamp the workpiece absent a plasma; a second pole of the ESC provides the return path. This configuration uses both the positive and negative potential of the DC power supply to electrostatically clamp the workpiece.

A tripolar ESC contains three poles. The inner two poles are similar to the bipolar configuration, and are used to clamp the workpiece. The outer pole can be used as either a plasma shield or a workpiece bias pickup point. U.S. Pat. No. 5,572,398 discloses a tri-polar electrostatic clamp using separate positive and negative electrodes housed on a non-polarized base.

Multi-pole ESC's use either AC or DC that is phased to each pole of the electrode. The phasing of the voltage applied to the electrode permits rapid clamping and release. The supply and control circuitry required for a multi-pole type of ESC is more complicated than for the monopole, bipolar or tripolar configurations. The multi-pole configuration is used to minimize charge build up on the workpiece and also helps reduce de-clamping issues.

The materials and processes used in processing a semiconductor substrate such as a wafer are extremely temperature sensitive. Excessive temperature fluctuations in the substrate may compromise system performance and the resulting properties of the semiconductor device. Thus, in order to adequately control the temperature of the substrate, good thermal contact between the substrate and the substrate holder is desired.

To facilitate heat transfer between the substrate and substrate holder, a very large electrostatic or physical force is commonly used in an attempt to cause the greatest amount of wafer surface to physically contact a support surface of the substrate holder. Due to surface roughness of both the substrate and the holder, however, when the two surfaces are pressed against each other only point contacts are established; i.e., small interstitial spaces (voids) constitute the majority of the interface. Under low pressure processing conditions, this interface is evacuated and the voids comprise a vacuum, which is a very good thermal insulator. Thus, heat transfer between the two surfaces is limited mainly to the point contacts.

To improve temperature uniformity across the substrate during processing, an inert, high thermal conductivity gas such as helium is pumped into the interstitial spaces formed between the substrate and the support surface. This heat transfer gas acts as a more efficient thermal transfer medium between the substrate and the substrate holder than the vacuum it replaces.

Some ESC devices are designed to minimize escape of heat transfer gas into the surrounding low pressure atmosphere (i.e., the reaction chamber). The support surface in such a device can have a circumferential raised rim having a diameter that is approximately equal to the diameter of the wafer and a flex circuit covering the support surface of the underlying pedestal. The flex circuit is usually a conductive material encased in a flexible dielectric material. The conductive material is patterned to form the electrostatic electrode. The dielectric material insulates the conductive material from other conductive components and also acts as a gasket. Once the wafer is clamped, a gas tight seal is created between the wafer and the rim. As such, heat transfer gas leakage from beneath the wafer at the rim is minimized. An electrostatic substrate holder comprising a lip seal for clamping substrates is disclosed in commonly-owned U.S. Pat. No. 5,805,408. Electrostatic substrate holders comprising flex circuits are disclosed in U.S. Pat. Nos. 6,278,600 and 6,033,478.

As described above, adequate wafer temperature control can be obtained through backside He gas pressure and electrostatic clamping techniques. In addition to substrate temperature control, however, temperature control of all the reactor surfaces that come into contact with active process chemistry is desirable for process repeatability and uniformity. Various upper electrode heating and cooling designs have been developed and are being used in semiconductor processing apparatus, for example parallel plate dielectric etchers. A reaction chamber component having improved temperature uniformity is disclosed in commonly-owned U.S. Pat. No. 6,123,775.

As shown schematically in FIG. 1, in some prior art designs the upper electrode plate 150 is held against a temperature controlled heat sink plate 110 via a backing ring 120. The electrode 150 is a planar disk having uniform thickness from center to edge thereof. The temperature of the heat sink plate is maintained by circulating a heated or cooled liquid through channels 114 within the plate. The heat sink plate is furnished with a process gas feed 134 for supplying gas to the process chamber. The gas then is dispersed through a plenum 140 and passes through gas dispersion holes (not shown) in the electrode to evenly disperse the process gas into the reaction chamber. According to this design, most of the thermal contact between the electrode 150 and the heat sink plate 110 is established at the periphery of the electrode where force from a peripheral mechanical clamp 160 is directly applied. The advantage of this technique is that the electrode plate, which is a consumable part, is separable from the heat sink plate. The disadvantage, however, is that the limited peripheral contact between the electrode and heat sink plate results in large center-to-edge temperature non-uniformity in the electrode.

As shown in FIG. 2, the center-to-edge temperature non-uniformity problem of limited thermal contact has been addressed in designs that use a backing plate 220 that can be bonded or brazed to the main electrode 250. The electrode plate/backing plate assembly are held in contact with heat sink plate 210 using clamping bolts 264. As in the previous example, the temperature of the heat sink plate 210 is maintained by circulating a heated or cooled liquid through channels 214 within the plate. The heat sink plate is also furnished with a process gas feed 234 for supplying gas to the process chamber. The gas is distributed through one or more horizontally spaced apart plenums 240 and passes through gas dispersion holes 254 in the backing plate and in the electrode (not shown) to evenly disperse the process gas into the reaction chamber. Because the whole assembly (electrode plate 250 and backing plate 220) become a consumable part, however, such an approach is expensive to implement. An electrode clamping assembly wherein the electrode is mechanically and removably attached to the backing plate is disclosed in commonly-owned U.S. Pat. No. 5,569,356.

Accordingly, there is a need for an economical electrode design that provides improved thermal uniformity.

SUMMARY OF THE INVENTION

The present invention provides an electrode arrangement that improves the heat transfer between a backing plate and a showerhead electrode plate by positioning a compliant material between the two interfaces. The compliant material conforms to the surface irregularities of the two abutting surfaces and provides better thermal contact. The showerhead electrode includes an electrostatic chuck that further improves the thermal contact by applying a compressive force between the electrostatic plate and the electrode plate.

According to one aspect of the invention, the apparatus for retaining an electrode plate in a semiconductor processing chamber comprises a backing plate having an electrode plate receiving surface; an electrostatic holding apparatus disposed upon the electrode plate receiving surface, the electrostatic holding apparatus having an electrode plate support surface; an electrode plate having a lower surface facing a semiconductor substrate to be processed and an upper contact surface; and a mechanical clamping member engaging the outer periphery of the electrode and pressing the upper contact surface against the electrode plate support surface.

The electrostatic holding apparatus of the invention can comprise a first dielectric layer, a conductive layer disposed below the first dielectric layer, and a second dielectric layer disposed below the conductive layer. The first dielectric layer, the conductive layer, and the second dielectric layer can comprise at least one process gas port. Preferably, the first and second dielectric layers comprise a compliant material such as, for example, silicone or polyimide. The conductive layer of the electrostatic holding apparatus can comprise aluminum, copper, titanium, tungsten, molybdenum, nickel, silver, gold, iridium, platinum, ruthenium, ruthenium oxide, graphite, titanium nitride, titanium aluminum nitride, titanium carbide, or combinations thereof.

The electrostatic holding apparatus can have a thickness of 0.005 to 0.015 inches and can have a bipolar or multipolar design. Preferably, the electrostatic holding apparatus can further comprise a heating element to provide resistive heating of the electrode plate. According to a preferred embodiment, the electrode plate can comprise a showerhead electrode and the backing plate and electrostatic holding apparatus can include at least one process gas port for supplying a process gas to the plasma reaction chamber. The electrode plate can comprise single crystal silicon, graphite, or silicon carbide. Preferably, the ratio of the area of the electrostatic holding apparatus to the area of the upper contact surface is greater than 80%.

The invention also relates to a method of assembling a showerhead electrode assembly of a plasma reaction chamber. The method includes arranging a backing plate having an electrode plate receiving surface, and an electrostatic holding apparatus with an upper surface adhesively attached to the electrode plate receiving surface, the electrostatic holding apparatus having an electrode plate support surface opposite the upper surface. The method further includes arranging a showerhead electrode plate having a lower surface facing a semiconductor substrate to be processed and an upper contact surface such that the upper contact surface faces the electrode plate support surface; engaging a mechanical clamping member with the outer periphery of the showerhead electrode plate and pressing the upper contact surface against the electrode plate support surface; and applying a voltage to the electrostatic holding apparatus to electrostatically attract the showerhead electrode plate to the electrode plate support surface.

According to a preferred method, the electrostatic holding apparatus can comprise a first compliant dielectric layer, a conductive layer disposed below the first compliant dielectric layer, and a second compliant dielectric layer disposed below the conductive layer, the second compliant dielectric layer having an electrode plate support surface such that the electrode plate support surface conforms to the upper contact surface when the showerhead electrode plate is electrostatically attracted to the electrode plate support surface. The process also includes arranging the backing plate, electrostatic holding apparatus, and showerhead electrode plate so as to include at least one process gas port for supplying a process gas to the plasma reaction chamber. According to a preferred process, the electrostatic holding apparatus can further comprise a heating element to provide resistive heating of the showerhead electrode plate.

The invention also provides a method of processing a semiconductor substrate such as a single wafer in a plasma reaction chamber. The method includes transferring a semiconductor substrate into the plasma reaction chamber; supplying a process gas to the plasma reaction chamber; applying a voltage to an electrostatic holding apparatus to electrostatically attract an electrode plate to an electrode plate support surface during processing of the substrate; and supplying electrical power to the electrode causing the process gas to form a plasma for processing an upper surface of the substrate. The method can be used to etch a layer of material on the substrate, such as a silicon dioxide layer. The method can also be used to deposit a layer of material on the substrate. The method can also include supplying electrical power to the electrostatic holding apparatus to heat the electrode plate during processing of the substrate.

BRIEF DESCRIPTION OF THE DRAWINGS

Various features and advantages of the invention will become apparent from the following detailed description of preferred embodiments in connection with the accompanying drawings in which like numerals designate like elements and in which.

DETAILED DESCRIPTION OF THE INVENTION

The present invention relates to an economical showerhead electrode design for semiconductor processing equipment such as plasma etchers. The showerhead design can overcome disadvantages of prior art assemblies by providing improved thermal uniformity in the showerhead electrode, lower cost, and improved process uniformity. For example, the showerhead design can improve the heat transfer between a backing plate and a showerhead electrode plate by positioning a compliant material between the two interfaces. Under the application of a compressive force, the compliant material conforms to the surface irregularities of the electrode plate, provides better thermal contact with the backing plate, and improves the temperature uniformity across the electrode. An electrostatic holding apparatus, which comprises the compliant material, is used to provide an electrostatic force that draws the electrode plate into thermal contact with the backing plate. According to an embodiment of the invention, the showerhead electrode plate is brought into initial contact with the backing plate using a mechanical clamp, and is brought into good thermal contact with the backing plate by actuation of the electrostatic holding apparatus.

Because the temperature of the showerhead electrode that faces a semiconductor substrate to be processed (such as a wafer) can affect the process results indirectly either by changing the process chemistry or by changing the gas density locally above the substrate, controlling and maintaining adequate temperature uniformity on the showerhead electrode is desirable for reactor design. This is especially desirable in narrow gap (1 to 2 cm) parallel plate dielectric plasma etch reactors.

Figure 1:
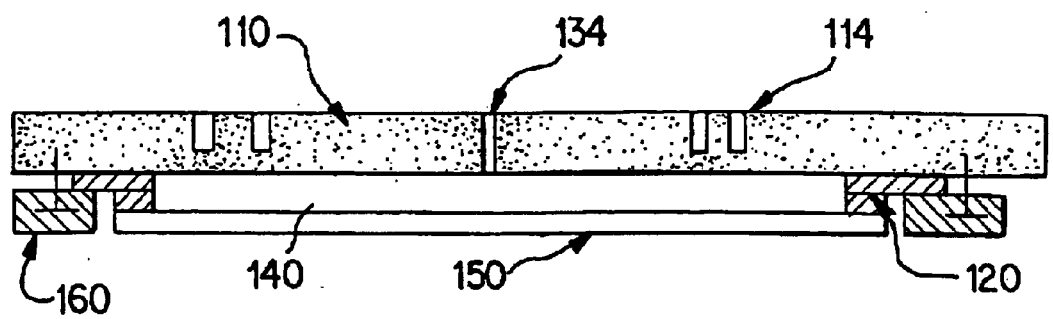
FIG. 1 depicts a prior art electrode plate attached to a backing plate using a circumferential clamp.
Figure 2:
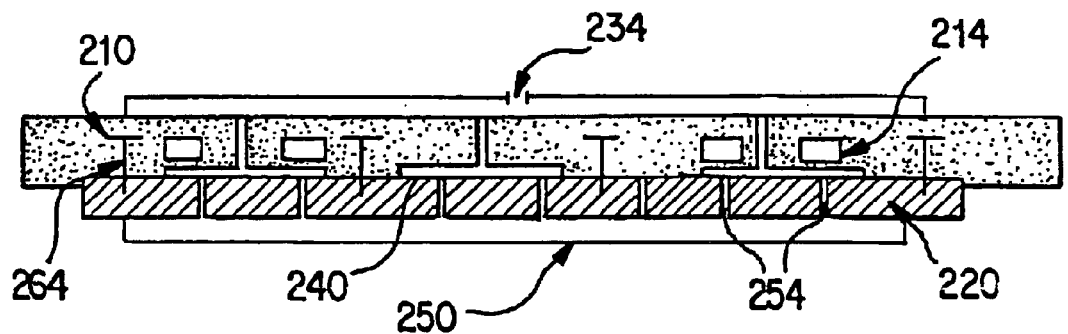
FIG. 2 depicts a prior art electrode plate attached to a backing plate using bonding or soldering.
Figure 3:
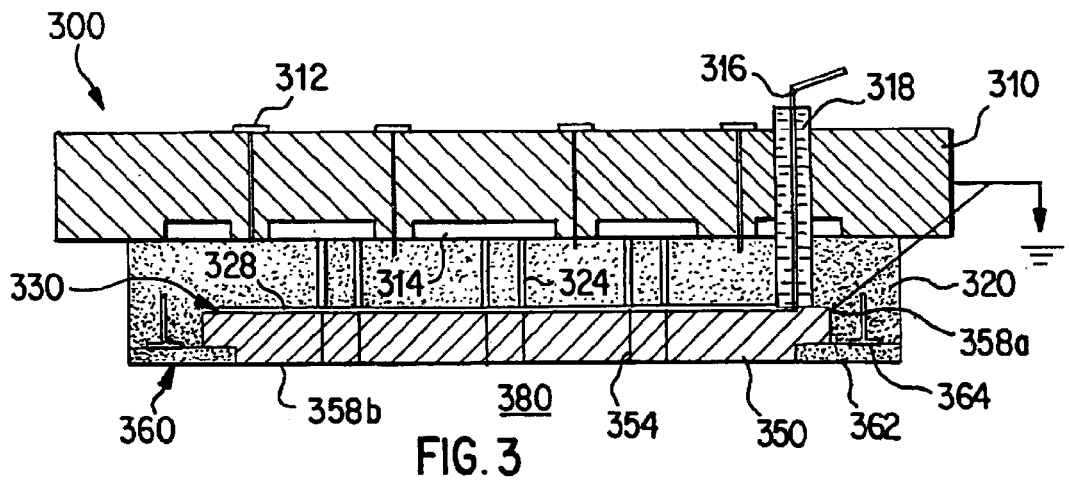
FIG. 3 shows a cross sectional view of an electrostatic showerhead electrode apparatus according to the present invention.

FIG. 3 shows a cross-sectional view of an electrostatic showerhead electrode assembly 300 according to a preferred embodiment of the present invention. The apparatus is situated within a process chamber of a semiconductor wafer processing system such as, for example, a parallel plate dielectric plasma etcher (not shown). The electrostatic showerhead electrode assembly 300 includes an upper plate 310, such as a water-cooled aluminum or stainless steel plate, a temperature-controlled backing plate (heat sink plate) 320, such as a high purity silicon carbide backing plate, and an electrode plate 350, such as a single crystal silicon electrode plate. Although the electrode plate can be electrically powered, the upper plate 310 and the electrode plate 350 are shown referenced to electrical ground. The backing plate 320 is held against the upper plate by upper clamping bolts 312, which pass through the upper plate 310. The backing plate comprises an electrode receiving surface 328, which is coextensive with the electrode plate 350. As shown, the backing plate 320 can be recessed to accommodate the electrode plate 350 within the recess. The electrode plate has an upper contact surface 358a and a lower surface 358b, which is exposed in the process chamber.

The electrode 350 preferably consists of an electrically conductive material such as single crystal silicon, graphite, or silicon carbide having uniform thickness from the center to the outer edge thereof. Electrodes having nonuniform thickness and/or comprising different materials, however, can also be used with the electrode assembly according to the invention. In a preferred embodiment, the electrode is a showerhead electrode provided with a plurality of spaced apart gas discharge passages 354, which are of a size and distribution suitable for supplying a process gas that is energized by the electrode to form a plasma in the reaction chamber beneath the electrode.

Figure 4:
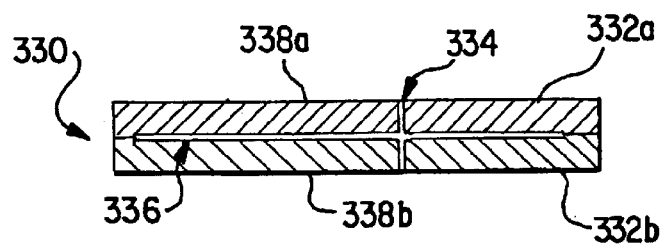
FIG. 4 shows a detailed view of the ESC element shown in FIG. 3.

Referring also to FIG. 4, the apparatus further comprises an electrostatic holding apparatus, such as ESC element 330. The ESC element 330 comprises a thin, flexible conductive element (metal foil) 336 embedded between thin layers of a compliant dielectric material 332a, 332b. ESC element 330 is disposed upon the electrode receiving surface 328 of the backing plate along a contact surface 338a, the ESC element also having an opposing electrode support surface 338b. The contact surface 338a of the ESC element 330 is bonded to the electrode receiving surface 328 of the backing plate by an adhesive layer (not shown). The conductive element 336 is connected to a DC power supply (not shown) by electrical conduits 316, which are fed through the backing plate and upper plate via electrical insulation 318. Under compression the compliant dielectric material conforms to surface irregularities of the electrode plate and improves heat transfer between the backing plate and the electrode plate.

The electrode plate 350 is removably held in position against the backing plate 320 by any suitable technique such as a mechanical clamp 360. Mechanical clamp 360 comprises a circumferential clamping ring 362 and a plurality of circumferentially spaced clamping bolts 364. When engaged, the clamping ring 362 engages the circumference of the electrode plate and presses the upper contact surface 358a of the electrode plate against the electrode support surface 338b of ESC element 330.

The use of a thin compliant material interposed between the electrode and backing plate requires sufficient compressive force to cause the compliant dielectric material to conform to the surface irregularities present across the contact surface 358a of the electrode in order to provide better heat transfer between the electrode and the backing plate. The compressive force is generated using an electrostatic clamp. Accordingly, the electrode plate 350 is held firmly against the backing plate 320 by using an electrostatic force. Electrostatic clamping between the surfaces is achieved by employing a high DC voltage on the thin conductive element 336 embedded in between the thin layers of compliant dielectric material 332a, 332b. When voltage from an external power supply is applied to the electrode element 336 an electrostatic force is generated between the electrode support surface of the thin conductive element and the electrode plate 350. The electrostatic force draws the electrode plate into intimate contact with the ESC element. Under the electrostatically-induced compressive force, the compliant dielectric material conforms to surface irregularities in the upper contact surface 358a of the electrode. The electrode plate and the backing plate will remain in good thermal contact while the DC voltage is supplied to the ESC element. The electrode plate can be removed from the backing plate by removing the DC voltage and disengaging mechanical clamp 360.

The ESC element 330 can comprise a single element or multiple elements arranged in any suitable manner. In a preferred embodiment, the ESC element 330 comprises a single ESC element arranged such that the upper contact surface 358a of the electrode plate is coextensive with the electrode support surface 338b of ESC element 330. However, the ratio of the area of the electrode support surface area to the area of the upper contact surface can be less than coextensive, e.g., 10 to 95%, greater than 50%, and more preferably greater than 80%. As much areal contact between the ESC element and the electrode is desirable to provide a higher compressive force and better thermal contact between the two components.

The power supplies and associated circuitry to accomplish these objectives will be apparent to persons skilled in the art. For instance, U.S. Pat. No. 4,464,223, the subject matter of which is hereby incorporated by reference, discloses details of power supplies and circuitry to supply DC and RF power to an electrode of an ESC for supporting a workpiece.

According to a preferred embodiment, the upper plate 310, backing plate 320, ESC element 330, and electrode plate 350 each comprise channels or passages 314, 324, 334, and 354, which permit passage of process gases from a process gas supply (not shown) to the interior of the reaction chamber 380.

In operation, the plasma etching gas which typically may be a mixture of fluorocarbons and/or fluorohydrocarbons such as $CF_4$ and $CHF_3$, and carrier gases such Ar and $N_2$, is delivered to the gas passages 314 in the upper plate and is dispersed within the space between the upper plate and the heat sink plate 320. The gas passes through a series of channels or passages 324, 334, 354 in the backing plate 320, ESC element 330, and electrode plate 350, respectively. In this way the process gas is evenly dispersed across a wafer undergoing processing so as to effect, for example, uniform etching of the wafer.

The conductive element 336 is preferably a conductive foil having a uniform thickness of from 5 to 500 microns. The conductive element is preferably masked and etched to form an electrode pattern. However, the conductive element may be any suitable metallic or ceramic conductor such as, for example, aluminum, copper, titanium, tungsten, molybdenum, nickel, silver, gold, iridium, platinum, ruthenium, ruthenium oxide, graphite, titanium nitride, titanium aluminum nitride, titanium carbide, or combinations thereof.

The compliant dielectric material can be any suitable electrically insulating material that is compatible with vacuum processing such as RTV, Kapton, silicone, polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, rubber or the like. A preferred material to form the conformal layers comprises polyimide. Polyimide is sufficiently resilient to deform slightly under the electrostatic clamping pressure and thus provide enhanced heat transfer. Polyimide also provides superior temperature resistance and excellent dielectric properties. For example, polyimide has a high dielectric breakdown strength, ranging from 3,000 to 3,500 V/mil, which allows use of a thin layer that maximizes the electrostatic attractive force. Polyimides are also resistant to temperatures in excess of 100° C., and more preferably in excess of 200° C., allowing use of the clamp for high temperature processes. Preferably, the conformal dielectric material also has a high thermal conductivity, at least about 0.10 W/m K, so that the electrode plate is in good thermal contact with the backing plate. The thickness of the ESC element 330 is preferably less than 0.1, more preferably less than 0.05, and most preferably less than or equal to 0.01 inches.

Figure 5:
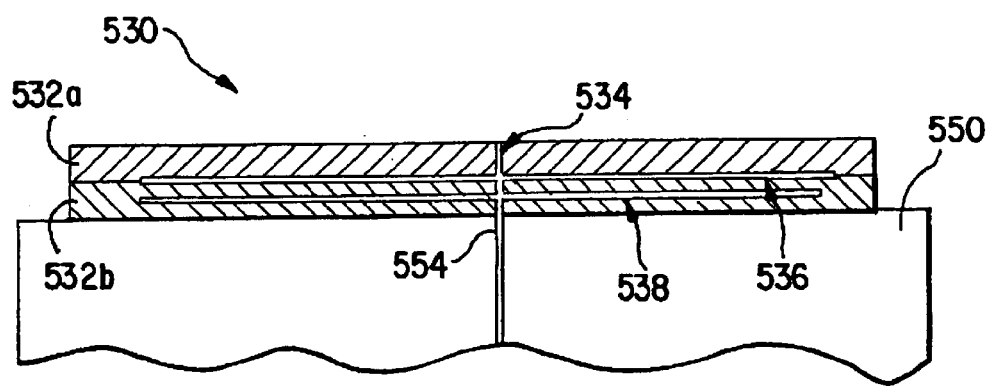
FIG. 5 shows a combined ESC element/heater element.

According to a further embodiment of the invention, the ESC element can optionally contain a heater element positioned above or below and electrically isolated from the ESC conductive element to uniformly heat the electrode plate. Referring to FIG. 5, a combined ESC element/heater element 530 is shown. Element 530 comprises a thin conductive element 536 sandwiched between thin compliant dielectric layers 532a and 532b. Additionally, the ESC element further comprises a heater element 538 buried in layer 532b. ESC element 530 and electrode plate 550 also contains passages or channels 534 and 554, respectively, for the passage of process gases into the reactor chamber.

Details of a suitable heater electrode pattern are shown in commonly-owned U.S. Pat. No. 5,880,922 the subject matter of which is hereby incorporated by reference. If desired, the heater electrode can comprise a spiral coil divided into more than one heater zone. For instance, one of the heaters can comprise an inner group of turns while the other heater can comprise an outer group of turns. The combined ESC element/heater element can be used to uniformly heat the electrode plate to a desired temperature and/or compensate for non-uniform heat distribution across the electrode plate during processing. The compliant dielectric layers distribute the heat from the heater and thereby provide for indirect resistive heating of the electrode plate. Preferably, the resistive heating element comprises a planar shape that is sized to correspond to the size of the electrode plate to provide a heat flux that is relatively uniform across the backside of the electrode plate. The thickness of the combined ESC element/ heater element is preferably from 0.005 to 0.015 inches. The resistive heating element is electrically connected to a heater power supply (not shown) to power the heater.

The electrostatic clamping element of the invention can be manufactured in various ways. All of the dielectric compliant layers with metal clamping electrodes and/or heater electrodes can be bonded together simultaneously, for example, by isostatically pressing together a pre-assembled stack of the component layers. Another method includes forming a laminate of a compliant dielectric layer and a conductive layer, patterning and etching an electrode pattern on the conductive layer, adhering a second dielectric layer to the electrode pattern to form an electrostatic clamping element, and laminating the electrostatic clamping element to an electrode receiving surface of a backing plate.

The conductive element can be provided on dielectric compliant sheets by any suitable process. For instance, electrically conductive paste such as tungsten can be silk screened in desired patterns on polyimide sheets.

Alternatively, the conductive element layer can be deposited and subsequently etched to provide the desired pattern of clamping electrodes or heater electrodes. In the case of conductive element layers 336 and 536, the pattern can comprise alternating rings having a height perpendicular to the plane of the dielectric sheet of 0.0008 inches, a width parallel to the plane of the dielectric sheet of about 10 mm, and the rings can be separated by gaps of about 0.5 mm.

The electrostatic clamping element of the invention advantageously reduces the consumable cost for the upper electrode plate by allowing the electrode plate and the backing plate to be maintained as separable parts. In addition, the electrostatic clamping element of the invention provides good heat transfer between the electrode plate and backing plate, and thus provides for good temperature uniformity across the upper electrode plate during processing. Furthermore, the electrostatic clamping element of the invention maintains a good RF ground for the upper electrode.

The apparatus according to the invention is useful for wafer processing such as plasma etching, deposition, etc., in multiple or single wafer processing. For instance, the apparatus can be used for etching or depositing BPSG, oxides such as thermal silicon dioxide, or pyrolytic oxides and photoresist materials.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. An apparatus for retaining an electrode plate in a plasma reaction chamber, comprising:
    a backing plate having an electrode plate receiving surface;
    an electrostatic holding apparatus disposed upon said electrode plate receiving surface, the electrostatic holding apparatus having an electrode plate support surface; and
    an electrode plate having a lower surface facing a substrate to be processed and an upper contact surface, the electrostatic holding apparatus being operable to compress the upper contact surface against the electrode plate receiving surface.

2. The apparatus of claim 1, further comprising a mechanical clamping member engaging the outer periphery of the electrode and pressing the upper contact surface against the electrode plate support surface.

3. The apparatus of claim 1, wherein the electrostatic holding apparatus comprises a first dielectric layer, a conductive layer disposed below said first dielectric layer, and a second dielectric layer disposed below said conductive layer, the first and second dielectric layers comprising a compliant material.

4. The apparatus of claim 3, wherein the first and second dielectric layers comprise silicone or polyimide.

5. The apparatus of claim 3, wherein the conductive layer comprises aluminum, copper, titanium, tungsten, molybdenum, nickel, silver, gold, iridium, platinum, ruthenium, ruthenium oxide, graphite, titanium nitride, titanium aluminum nitride, titanium carbide, or combinations thereof.

6. The apparatus of claim 3, further comprising at least one process gas port extending through the first dielectric layer, the conductive layer, and the second dielectric layer.

7. The apparatus of claim 1, wherein the electrostatic holding apparatus has a thickness of 0.005 to 0.015 inches.

8. The apparatus of claim 1, wherein the electrostatic holding apparatus has a bipolar or multipolar design.

9. The apparatus of claim 1, wherein the electrostatic holding apparatus further comprises a resistive heating element.

10. The apparatus of claim 1, wherein the electrode plate comprises a showerhead electrode and the backing plate and electrostatic holding apparatus include at least one process gas port through which process gas can be supplied to the plasma reaction chamber.

11. The apparatus of claim 1, wherein the electrode plate comprises single crystal silicon, graphite, or silicon carbide.

12. The apparatus of claim 1, wherein the electrostatic holding apparatus is in contact with at least 80% of the total surface area of the upper contact surface.

13. A method of processing a semiconductor substrate in a plasma reaction chamber using the apparatus according to claim 1, the method comprising:
    transferring a semiconductor substrate into the plasma reaction chamber;
    supplying process gas to the plasma reaction chamber through the electrode plate; and
    applying voltage to the electrostatic holding apparatus which electrostatically clamps the electrode plate to a temperature controlled member.

14. The method of claim 13, wherein the method includes etching a layer of material on the semiconductor substrate.

15. The method of claim 13, wherein the method includes etching of a silicon dioxide layer on the semiconductor substrate.

16. The method of claim 13, wherein the method includes depositing a layer of material on the semiconductor substrate.

17. The method of claim 13, wherein the method includes supplying electrical power to a resistive heating element in the electrostatic holding apparatus so as to heat the electrode plate.

18. A method of assembling an apparatus for retaining an electrode plate in a plasma reaction chamber, comprising;
    attaching an electrostatic holding apparatus to an electrode plate receiving surface, the electrostatic holding apparatus having an electrode plate support surface of a backing plate; and
    operating the electrostatic holding apparatus to compress an upper contact surface of an electrode plate against the electrode plate receiving surface, a lower surface of the electrode plate facing a substrate to be processed.

19. The method of claim 18, wherein the electrostatic holding apparatus comprises a first compliant dielectric layer, a conductive layer disposed below said first compliant dielectric layer, and a second compliant dielectric layer disposed below said conductive layer, said second compliant dielectric layer conforming to the upper surface of the electrode plate.

20. The method of claim 18, wherein the backing plate, electrostatic holding apparatus, and electrode plate include at least one process gas port supplying process gas to the plasma reaction chamber.

21. The method of claim 18, wherein the electrostatic holding apparatus further comprises a resistive heating element heating the electrode plate.

22. The method of claim 18, wherein the ratio of contact area between the electrostatic holding apparatus and the electrode plate is at least 80%.

* * * * *